(12) United States Patent
Kaneshima et al.

(10) Patent No.: US 8,281,838 B2
(45) Date of Patent: Oct. 9, 2012

(54) WORK BONDING AND SUPPORTING METHOD AND WORK BONDING AND SUPPORTING APPARATUS USING THE SAME

(75) Inventors: Yasuji Kaneshima, Mie-ken (JP); Masayuki Yamamoto, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/339,657

(22) Filed: Dec. 29, 2011

(65) Prior Publication Data

US 2012/0097338 A1 Apr. 26, 2012

Related U.S. Application Data

(62) Division of application No. 11/699,414, filed on Jan. 30, 2007, now Pat. No. 8,110,058.

(30) Foreign Application Priority Data

Feb. 9, 2006 (JP) .................................. 2006-032637

(51) Int. Cl.
*B32B 37/00* (2006.01)
(52) U.S. Cl. ...... 156/494; 156/522; 156/582; 156/583.1
(58) Field of Classification Search .................. 156/494, 156/510, 522, 580, 581, 582, 583.1
See application file for complete search history.

(56) References Cited

U.S. PATENT DOCUMENTS

| 4,743,334 | A | 5/1988 | Singer |
| 5,328,536 | A | 7/1994 | Rohleder et al. |
| 7,078,262 | B2 | 7/2006 | Yamamoto et al. |
| 7,406,759 | B2 * | 8/2008 | Yamamoto et al. ............. 29/559 |
| 7,987,886 | B2 * | 8/2011 | Yamamoto et al. ........... 156/522 |
| 8,110,058 | B2 * | 2/2012 | Kaneshima et al. .......... 156/228 |
| 2003/0133762 | A1 | 7/2003 | Yamamoto et al. |
| 2004/0013850 | A1 | 1/2004 | Kling |
| 2004/0106301 | A1 | 6/2004 | Teshirogi et al. |
| 2004/0140039 | A1 | 7/2004 | Yamamoto |
| 2004/0238118 | A1 | 12/2004 | Miyamoto |

FOREIGN PATENT DOCUMENTS

| CN | 1422791 A | 6/2003 |
| JP | 2005-033119 A | 2/2005 |

OTHER PUBLICATIONS

The First Office Action for Application No. 200710028863 from the State Intellectual Property Office of the People's Republic of China dated Nov. 20, 2009.

* cited by examiner

*Primary Examiner* — James Sells
(74) *Attorney, Agent, or Firm* — Cheng Law Group, PLLC (57) ABSTRACT

Tape heating means is allowed to come close to an adhesive tape for support and, in a heating state, the adhesive tape for support is stretched and tensioned with proper tension in a tape width direction and a transport direction. A heated work is bonded to an adhesive face of the tensioned adhesive tape for support, thereby supporting the work.

8 Claims, 11 Drawing Sheets

WORK BONDING AND SUPPORTING METHOD AND WORK BONDING AND SUPPORTING APPARATUS USING THE SAME

CROSS-REFERENCE TO RELATED APPLICATIONS

The present application is a Divisional Application of application Ser. No. 11/699,414, filed Jan. 30, 2007 now U.S. Pat. No. 8,110,058, which is based on Japanese Patent Application No. 2006/032637, filed Feb. 9, 2006, the entire contents of which are hereby incorporated into the present application by reference.

BACKGROUND OF THE INVENTION

1. Field of the Invention

The present invention relates to a method for bonding a work to an adhesive tape for support to support the work as a process performed before carriage of a thin-plate-shaped work such as a semiconductor wafer or a glass substrate and various processes to be performed on the work, and to a work bonding and supporting apparatus using the method.

2. Description of the Related Art

In a process of cutting out semiconductor chips from a semiconductor wafer (hereinbelow, simply called "wafer") as a representative thin-plate-shaped work, a wafer is supported by being bonded to an adhesive tape for support which is bonded to a ring frame. After that, a dicing process and a chip cutting process are performed on the bonded and supported wafer (refer to Japanese Patent Laid-Open No. 2005-033119).

The conventional method, however, has the following problems.

In the process of adhering a wafer to an adhesive tape for support, while heating the wafer by a heater assembled in a vacuum table for vacuum-holding a wafer, the wafer is bonded to an adhesive face of an adhesive tape for support while heating the wafer by the heater. In such a manner, the adhesiveness of the adhesive tape for support is enhanced. However, depending on the wafer heating temperature or the kind of the adhesive tape for support, the adhesive tape for support elongates due to heat radiated from the wafer and the vacuum stage. Due to this, the wafer is bonded to and supported by the adhesive tape for support in a state where a wrinkle occurs in the adhesive tape for support, and a problem occurs in following processes.

As means for facilitating mounting of semiconductor chips diced from a wafer onto a board, an adhesive layer is formed on the back side of a semiconductor chip. Specifically, an adhesive layer is formed in advance on the back face of a wafer, the wafer with the adhesive layer is bonded to an adhesive tape for support, and various processes are performed. In such a case, when the wafer with the adhesive layer is bonded to the adhesive tape for support to thereby support the wafer, wafer heating temperature is set to be higher than that in the case of processing a wafer without an adhesive layer. Therefore, the wafer with the adhesive layer is more susceptible to an adverse influence that the adhesive tape for support elongates due to radiation heat.

SUMMARY OF THE INVENTION

The present invention has been achieved in view of such circumstances, and an object of the invention is to provide a work bonding and supporting method and a work bonding and supporting apparatus using the same capable of suitably bonding a heated thin-plate-shaped work to an adhesive tape for support without causing a wrinkle, thereby supporting the work.

To achieve such an object, the present invention employs the following configuration.

In a work bonding and supporting method for bonding a work to an adhesive tape for support to support the work, an adhesive tape for support is heated by tape heating means while tensioning the adhesive tape for support by tape tensioning means, and a work is bonded to an adhesive face of the heated and tensioned adhesive tape for support by work bonding means to thereby support the work.

In the work bonding and supporting method of the invention, an adhesive tape for support elongates due to heating and the elongated adhesive tape is tensioned so as to be stretched. Therefore, even if the adhesive tape for support is subjected to heat radiated from the heated work, a vacuum table for holding the heated work, and the like, the adhesive tape for support does not elongate any more. That is, the work is bonded to the adhesive tape for support and is supported in a state where there is no wrinkle.

In the case of the invention, preferably, the heated and tensioned adhesive tape for support is bonded to a ring frame by tape bonding means and, after that, the heated work is bonded to the adhesive face of the adhesive tape for support bonded to the ring frame by the work bonding means.

According to the method, the adhesive tape for support is bonded in a tensioned state to the ring frame without a room that the adhesive tape for support elongates due to radiation heat. Therefore, without causing a wrinkle in the tensioned adhesive tape for support, the work is bonded and supported.

In the invention, for example, the work is a semiconductor wafer having, on its back side, an adhesive layer to be mounted on a board.

In this case, even when a wafer is heated to high temperature and bonded in order to increase adhesion performance of a work to an adhesive tape for support, the work is bonded and supported without causing a wrinkle in an adhesive tape for support which is heated and tension in advance.

To achieve such an object, the invention also employs a work bonding and supporting apparatus for bonding a work to an adhesive tape for support to support the work, including: a ring frame transport mechanism for carrying a ring frame in a tape bonding position; tape supplying means for supplying a continuous adhesive tape for support to the tape bonding position in a posture that an adhesive face of the adhesive tape for support faces the back side of the ring frame; tape tensioning means for stretching the adhesive tape for support supplied to the tape bonding position by holding at least one or both of facing sides in the width direction of the adhesive tape for support and front and rear sides in the supply direction of the adhesive tape for support; tape heating means for heating the adhesive tape for support supplied to the tape bonding position; tape bonding means for pressing the adhesive tape for support against the back side of the ring frame; a tape cutting mechanism for cutting the adhesive tape for support bonded to the back side of the ring frame along the ring frame; and work bonding means for supplying and bonding a work in a heated state to the adhesion face of the adhesive tape for support bonded to the ring frame.

The work bonding and supporting apparatus of the invention can excellently execute the method of the invention.

The tape heating means is preferably a heat radiation plate facing in parallel with the adhesive tape for support in the tape bonding position or a nozzle for spraying warm air to the adhesive tape for support in the tape bonding position.

With the configuration, the adhesive tape for support can be uniformly heated by heat radiated from the entire face of a heat radiation plate. Alternatively, by uniformly spraying warm air from the nozzle to the adhesive tape for support, the adhesive tape for support can be heated.

Therefore, by eliminating nonuniformity caused by elongation, the whole face of the tape can be uniformly tensioned.

Preferably, the tape cutting mechanism has a cutter traveling along a travel locus corresponding to the shape of the ring frame, and the heat radiation plate is provided on the inside of the travel locus.

With the configuration, the heat radiation plate can be supported by the tape cutting mechanism and it is effective to simplify a heat radiation plate supporting structure.

Preferably, the work bonding means includes: a chuck table having therein a heater and vacuum-holding the surface of a work; a holding mechanism for holding a ring frame; a driving mechanism for moving a work to a tape bonding position by making the chuck table and the holding mechanism come close to each other; and a bonding roller that rolls while pressing the adhesive tape from the back side of the ring frame in the tape bonding position to bond the adhesive tape to the work.

Preferably, the tape bonding means is a press roller which rolls along the back side of the ring frame.

Further, the work bonding and supporting apparatus may be also constructed as follows. A plurality of press rollers as the tape bonding means are disposed at predetermined intervals along an adhesion face of the ring frame. A cutter in the tape cutting mechanism is disposed on the same travel locus as that of the press rollers. The apparatus further includes a roller moving mechanism for moving the press roller between a tape bonding position and a standby position apart from the ring frame, and cutter moving means for moving the cutter between a tape cutting position and a standby position apart from the ring frame.

Both of the roller moving mechanism and the cutter moving means are driven, for example, as follows.

First, the adhesive tape is bonded to the ring frame by the press roller, the press roller is returned to the standby position, after that, the cutter is moved to the tape cutting position to cut the adhesive tape.

Second, both of the roller moving mechanism and the cutter moving means are driven so as to cut a bonded adhesive tape by the cutter while bonding the adhesive tape to the ring frame by the press roller.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

DESCRIPTION OF THE PREFERRED EMBODIMENTS

Embodiments of a semiconductor wafer mounter utilizing the present invention will be described below with reference to the drawings.

Figure 1:
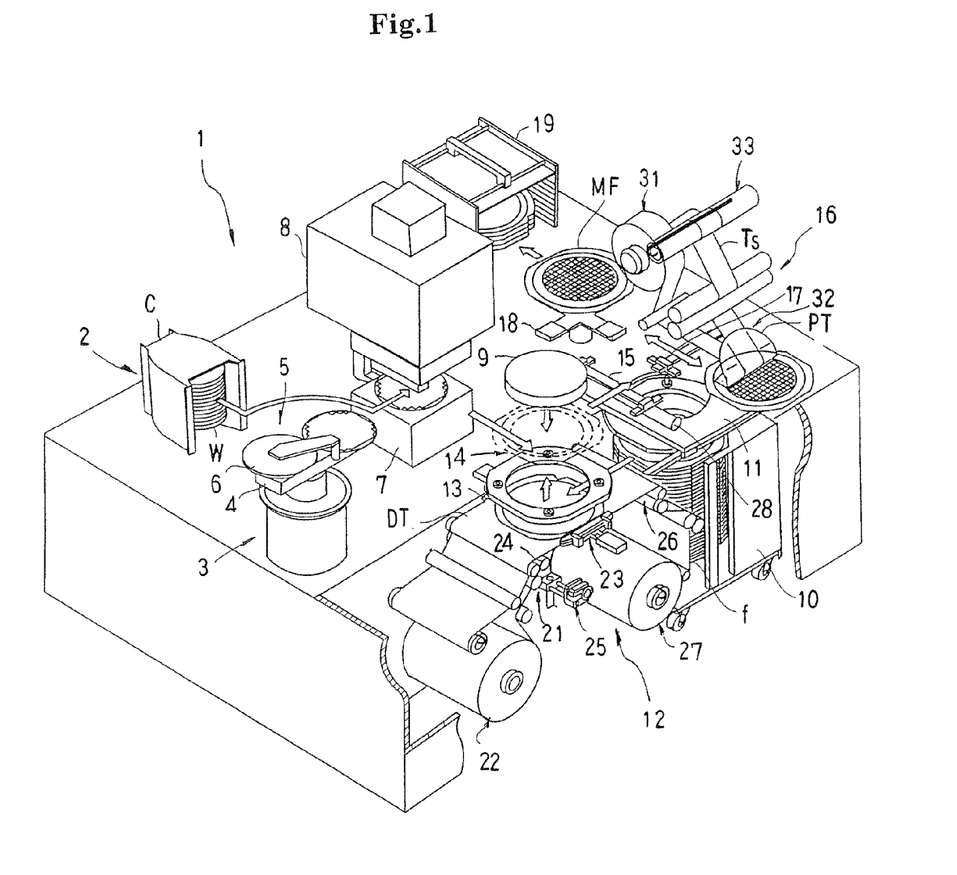
FIG. 1 is a cutaway perspective view showing a general configuration of a semiconductor wafer mounter.

FIG. 1 is a cutaway perspective view showing a general configuration of a semiconductor wafer mounter including a work bonding and supporting apparatus of the present invention.

A semiconductor wafer mounter 1 includes a wafer supplying unit 2 in which a cassette C housing wafers (works) W subjected to back grinding process in multiple stages is loaded, a wafer transport mechanism 3 having a robot arm 4 and a pressing mechanism 5, an alignment stage 7 for aligning a wafer W, an ultraviolet irradiating unit 8 for irradiating the wafer W mounted on the alignment stage 7 with ultraviolet rays, a vacuum table 9 holding the wafer W on its under face by vacuum, a ring frame supplying unit 10 housing ring frames "f" in multiple stages, a ring frame transport mechanism 11 for transferring the ring frame "f" onto an adhesive tape DT for support as a dicing tape, a tape processing unit 12 for bonding the adhesive tape DT for support from the back side of the ring frame "f", a ring frame elevating mechanism 13 for elevating the ring frame "1" on which the adhesive tape DT for support is bonded, a mount frame manufacturing unit 14 for manufacturing a mount frame MF by integrally bonding-supporting the wafer W by the ring frame "f" to which the adhesive tape DT for support is bonded, a first mount frame transport mechanism 15 for transporting the manufactured mount frame MF, a peeling mechanism 16 for peeling off a protection tape PT adhered to the surface of the wafer W, a second mount frame transport mechanism 17 for transporting the mount frame MF from which the protection tape PT was peeled off by the peeling mechanism 16, a turn table 18 for changing the direction of the mount frame MF and transporting the mount frame MF, and a mount frame collecting unit 19 housing the mount frames MF in multiple stages.

The wafer supplying unit 2 has a not-shown cassette stand. On the cassette stand, the cassette C housing the wafers W in multiple stages is mounted. The protection tape PT is adhered to a pattern face (surface) of each of the wafers W. At this stage, the wafer W maintains the horizontal posture with its pattern surface facing upward. An adhesive layer for board mounting is formed in advance on the back side of the wafer W.

The wafer transport mechanism 3 swings and moves in the vertical direction by a not-shown driving mechanism. Specifically, the wafer transport mechanism 3 adjusts the positions of a wafer holding unit in the robot arm 4 and a press plate 6 provided for the pressing mechanism 5. The wafer transport mechanism 3 also transports the wafer W from the cassette C to the alignment stage 7.

Figure 2:
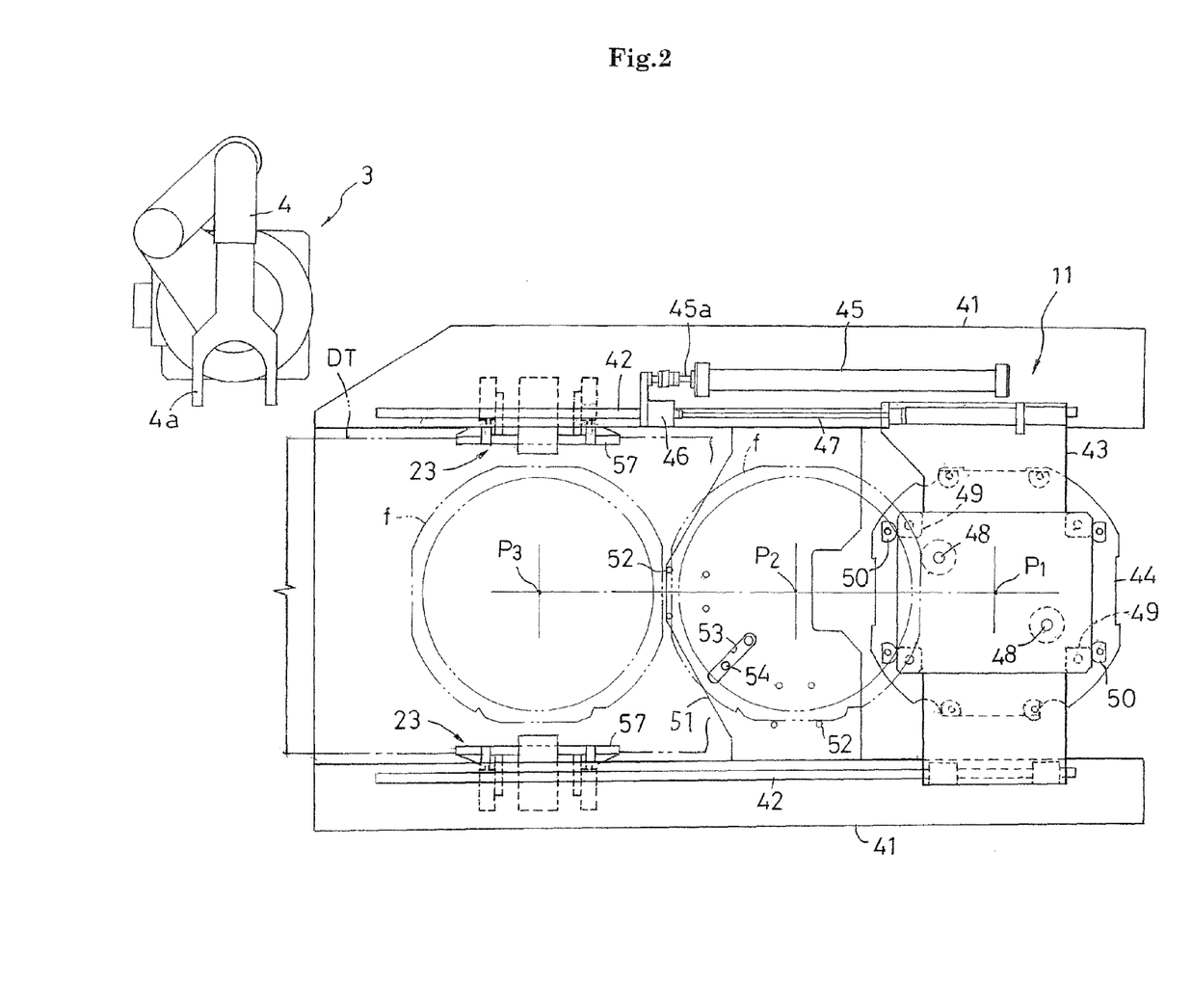
FIG. 2 is a plan view showing a ring frame transport mechanism and a tape tension mechanism.

The robot arm 4 of the wafer transport mechanism 3 includes at its end, as shown in FIG. 2, a wafer holding unit 4a having a horseshoe shape. The robot arm 4 is constructed so that the wafer holding unit 4a can enter and exit a space between the neighboring wafers W housed in multiple stages in the cassette C. A vacuum hole is formed in the wafer holding unit 4a at the tip of the robot arm 4 so that the wafer W can be vacuumed from the back side and held.

The pressing mechanism 5 of the wafer transport mechanism 3 has, at its tip, the circular press plate 6 having almost the same shape as that of the wafer W. The arm of the press plate 6 can move so that the press plate 6 is positioned above the wafer W mounted on the alignment stage 7.

The pressing mechanism 5 operates in the case where poor vacuum occurs when the wafer W is mounted on a holding table 8 of the alignment stage 7 which will be described later. Concretely, when a warp occurs in the wafer W and the wafer W cannot be held by vacuum, the press plate 6 presses the surface of the wafer W to correct the warp and make the surface flat. In this state, the holding table 8 vacuums the back side of the wafer W.

The alignment stage 7 positions the mounted wafer W on the basis of orientation flat, notch, or the like formed in the periphery of the wafer W and covers and vacuums the whole back side of the wafer W.

The alignment stage 7 can travel in a state where it holds the wafer W by vacuum between an initial position in which the wafer W is mounted and positioned and an intermediate position between the vacuum table 9 and the ring frame elevating mechanism 13 disposed in multiple stages above the tape processing unit 12 which will be described later.

The ultraviolet irradiating unit 8 is positioned above the alignment stage 7 in the initial position. The ultraviolet irradiating unit 8 irradiates the protection tape PT as an ultraviolet curing adhesive tape adhered to the surface of the wafer W with ultraviolet rays. By the irradiation of ultraviolet rays, the adhesion of the protection tape PT is lowered.

Figure 11:
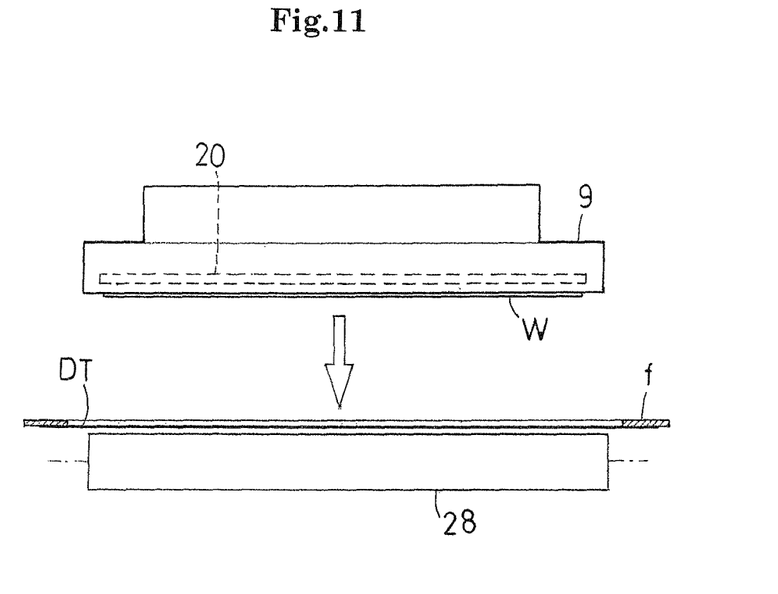
FIG. 11 is a schematic front view showing a work bonding process.
Figure 12:
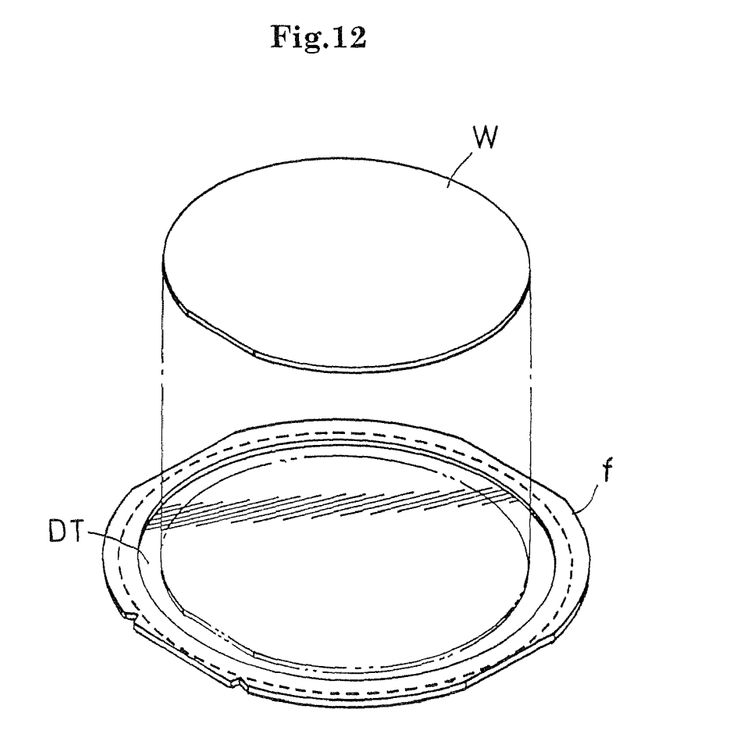
FIG. 12 is a perspective view showing a ring frame and a work.

The vacuum table 9 has a circular shape almost the same as that of the wafer W so as to be able to cover and vacuum the surface of the wafer W. By a not-shown driving mechanism, the vacuum table 9 lifts the wafer W from a standby position above the tape processing unit 12 to a bonding position in which the wafer W is bonded to the ring frame "f". The vacuum table 9 has therein a heater 20 as shown in FIG. 11. The heater 20 heats the vacuum-held wafer W to a desired temperature (tens ° C.) suitable to bonding to the adhesive tape DT for support.

The vacuum table 9 fits in the opening in the ring frame elevating mechanism 13 for vacuum-holding the ring frame "f" whose back side is bonded with the adhesive tape DT for support, and drops to a position close to the adhesive tape DT for support in the center of the ring frame "f".

The ring frame supplying unit 10 has a wagon-like structure whose bottom is provided with wheels. The ring frame supplying unit 10 is loaded in the apparatus body. The ring frame supplying unit 10 opens its top, slides up the ring frames "f" housed in multiple stages, and sends out the ring frame "f".

The ring frame transport mechanism 11 sequentially vacuums the ring frames "f" housed in the ring frame supplying unit 10 one by one from top, and horizontally transports the ring frame "f" to the bonding position of the adhesive tape DT for support. At the time of bonding the adhesive tape DT for support, the ring frame transport mechanism 11 also displays the function of holding the ring frame "f" in the tape bonding position.

The tape processing unit 1 has, as shown in FIG. 1, a tape supplying unit 22 for supplying the adhesive tape DT for support, a tape tension mechanism 23 for applying proper tension on the adhesive tape DT for support, a bonding unit 21 for bonding the adhesive tape DT for support to the ring frame "f", a tape cutting mechanism 25 for cutting out the adhesive tape DT bonded to the ring frame "f" along the shape of the ring frame "f", a peeling unit 26 for peeling off the unnecessary remaining tape after the cut of the tape cutting mechanism 25 from the ring frame "f", and a tape collecting unit 27 for collecting the unnecessary remaining tape after the cut. The bonding unit 21 corresponds to work bonding means of the invention. The tape supplying unit 22 corresponds to tape supplying means. The tape tension mechanism 23 corresponds to tape tension means.

The tape tension mechanism 23 sandwiches the adhesive tape DT for support in the width direction and applies proper tension on the adhesive tape DT for support by pulling the adhesive tape DT for support in the tape width direction.

The bonding unit 21 is disposed in a standby position which is diagonally downward (diagonally downward left in FIG. 1) of the ring frame "f" held above the adhesive tape DT for support. When the ring frame "f" is transported and held by the ring frame transport mechanism 11 to the bonding position of the adhesive tape DT for support and supply of the adhesive tape DT for support from the tape supplying unit 22 starts, a bonding roller 24 provided for the bonding unit 21 moves to a bonding start position on the right side in the tape supply direction.

The bonding roller 24 which reaches the bonding start position ascends to press the adhesive tape DT for support against the ring frame "f", thereby bonding the adhesive tape DT for support. The bonding roller 24 rolls from the bonding start position toward the standby position and bonds the adhesive tape DT for support to the ring frame "f" while pressing the adhesive tape DT for support.

The peeling unit 26 peels an unnecessary remaining portion of the adhesive tape DT for support cut by the tape cutting mechanism 25 from the ring frame "f".

The tape cutting mechanism 25 is disposed below the adhesive tape DT for support on which the ring frame "f" is mounted. When the adhesive tape DT for support is bonded to the ring frame "f" by the bonding unit 21, the tape cutting mechanism 25 ascends. The ascended tape cutting mechanism 25 cuts the adhesive tape DT for support along the ring frame "f".

The ring frame elevating mechanism 13 is in a standby position above the tape bonding position. After completion of the process of bonding the adhesive tape DT for support to the ring frame "f", the ring frame elevating mechanism 13 descends and holds the ring frame "f" by vacuum. The ring frame transport mechanism 11 which had held the ring frame "f" returns to the initial position above the ring frame supplying unit 10.

The ring frame elevating mechanism 13 holds the ring frame "f" by vacuum and, after that, ascends to the position of bonding to the wafer W. At this time, the vacuum table 9 holding the wafer W by vacuum also descends to the bonding position of the wafer W.

The mount frame manufacturing unit 14 has a bonding roller 28 whose peripheral face is elastic-deformable. The bonding roller 28 rolls while pressing a non-adhesive face (under face) of the adhesive tape DT for support bonded to the back side of the ring frame "f".

The first mount frame transport mechanism 15 vacuums the mount frame MF in which the ring frame "f" and the wafer "W" are integrally formed and transfers it onto a not-shown peeling table of the peeling mechanism 16.

The peeling mechanism 16 includes a not-shown peeling table on which the wafer W is mounted and transferred, a tape supplying unit 31 for supplying an adhesive tape Ts for peeling derived from a tape roller, a peeling unit 32 for bonding and peeling the adhesive tape Ts for peeling, and a tape collecting unit 33 for taking up the adhesive tape Ts for peeling and the protection tape PT peeled.

The second mount frame transport mechanism 17 vacuums the mount frame MF discharged from the peeling mechanism 16 and transfers it onto the turn table 18.

The turn table 18 is constructed to position the mount frame MF and houses the mount frame MF into the mount frame collecting unit 19. Specifically, when the mount frame MF is mounted on the turn table 18 by the second mount frame transport mechanism 17, alignment is performed on the basis of orientation flat in the wafer W, an alignment shape of the ring frame "f", and the like. To change the direction of housing the mount frame MF into the mount frame collecting unit 19, the turn table 18 turns. After the housing direction is determined, the turn table 18 pushes the mount frame MF by a not-shown pusher to house the mount frame MF into the mount frame collecting unit 19.

The mount frame collecting unit 19 is mounted on a not-shown elevatable mount table. By vertical movement of the mount table, the mount frame MF pushed by the pusher can be housed in an arbitrary stage in the mount frame collecting unit 19.

Figure 3:
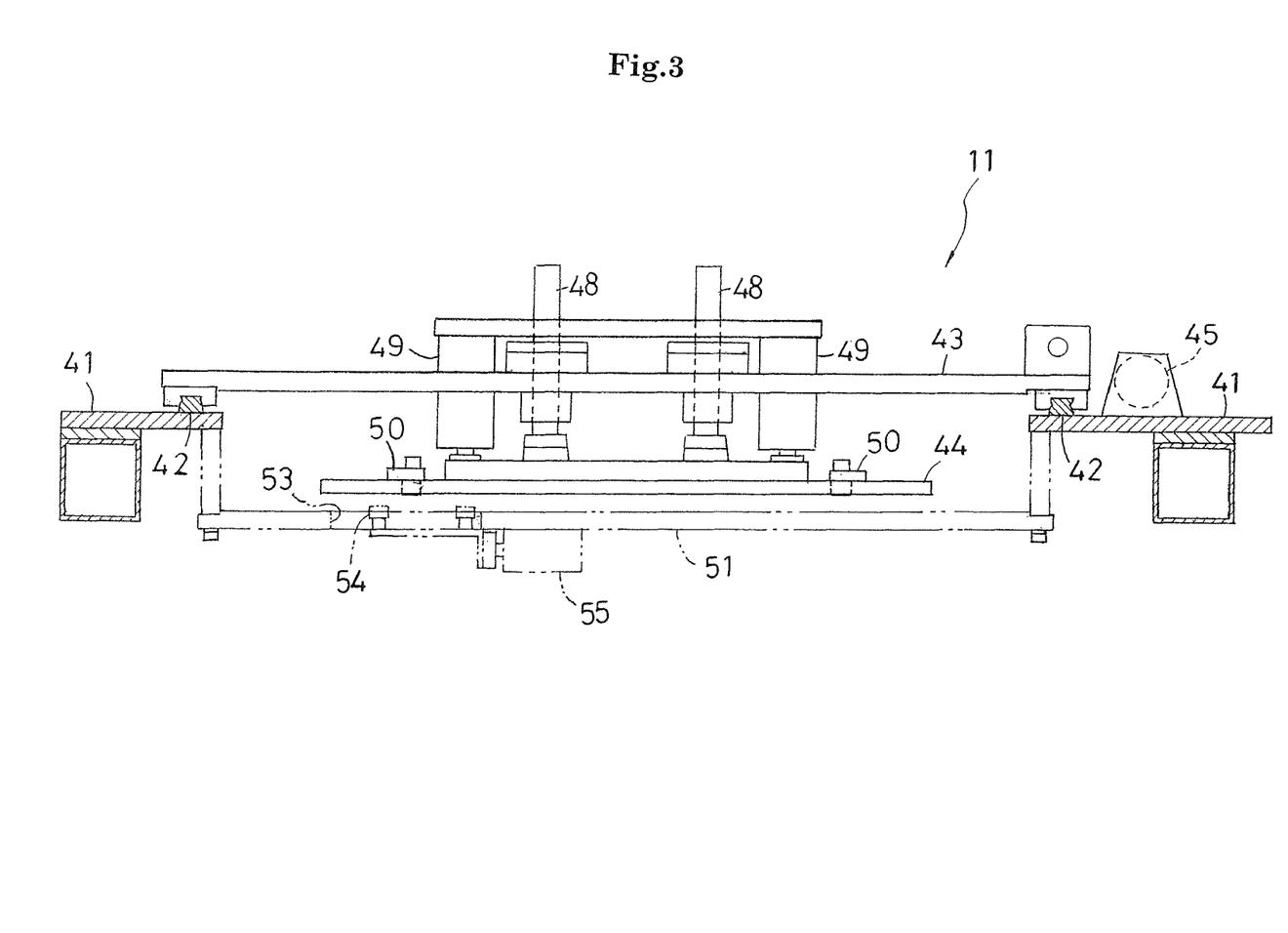
FIG. 3 is a front view showing the ring frame transport mechanism.
Figure 4:
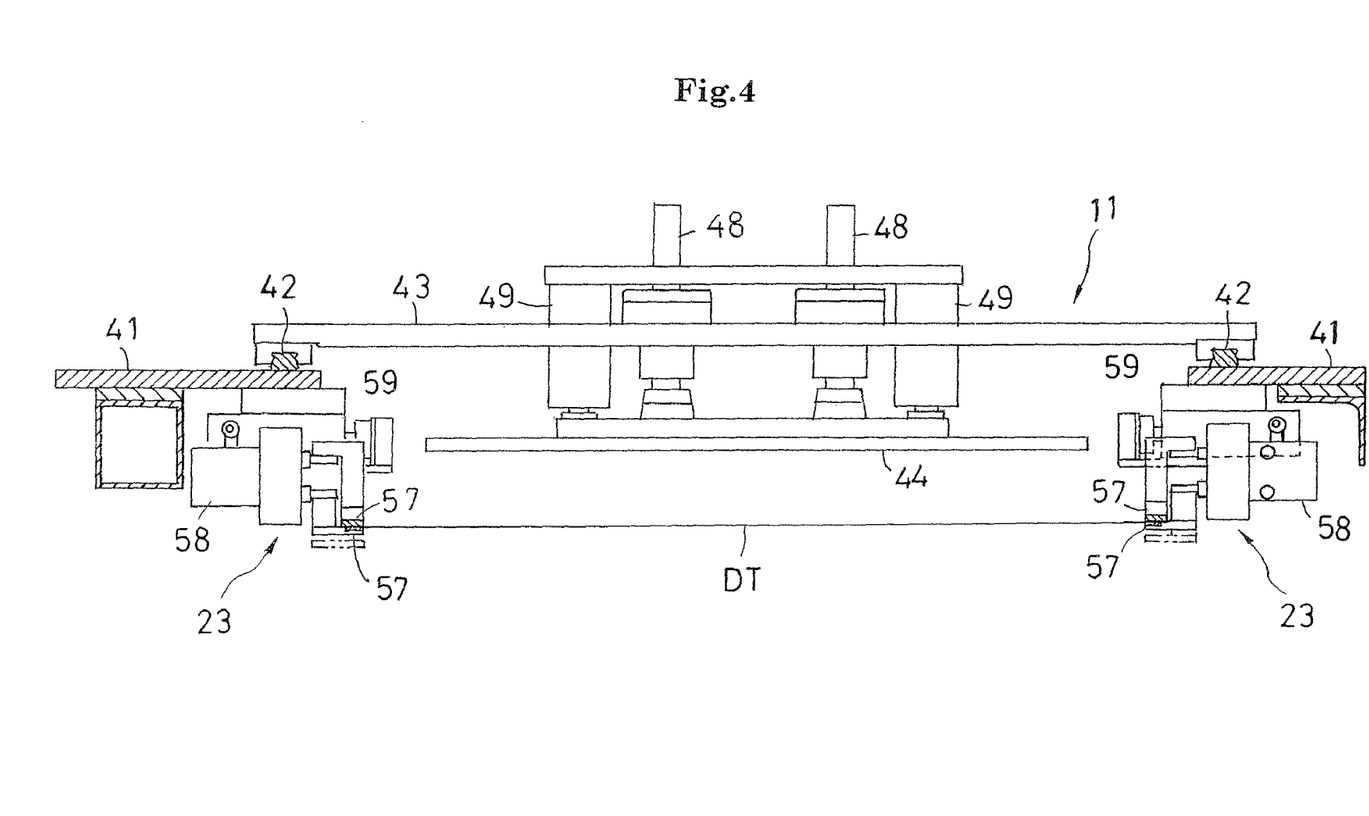
FIG. 4 is a front view showing the tape tension mechanism.

FIGS. 2 to 4 show detailed structures of the ring frame transport mechanism 11 and the tape tension mechanism 23.

As shown in FIG. 2, the ring frame transport mechanism 11 includes a pair of bases 41 disposed in parallel with each other at a predetermined interval, a movable frame 43 mounted so as to be horizontally movable (in the horizontal direction in the diagram) along rails 42 provided on the top face of the bases 41, and an elevating plate 44 elevatably mounted below the portable frame 43.

An air cylinder 45 is disposed above the pair of bases 41. A movable block 46 coupled to a piston rod 45a of the air cylinder 45 and the movable frame 43 are coupled to each other via a push-pull rod 47. With the expansion/contraction operation of the air cylinder 45, the movable frame 43 is reciprocated between a ring frame ejection position $P_i$ as the center position of the ring frame supplying unit 10 and a tape bonding position $P_3$.

As shown in FIGS. 2 to 4, the elevating plate 44 is supported by the movable frame 43 so as to be elevatable in parallel with each other via a pair of guide shafts 48, and driven by four air cylinders 49. Vacuum heads 50 exposing from the under face of the plate are attached in proper positions near the outer periphery of the elevating plate 44, and the top face of the ring frame "f" is vacuum-held by the vacuum heads 50.

In some midpoint between the ring frame ejection position $P_1$ and the tape bonding position $P_3$, an alignment stage 51 connecting the bases 41 is provided. On the top face of the alignment stage 51, two pairs of positioning pins 52 for receiving two straight edges orthogonal to each other formed in the outer periphery of the ring frame "f" are provided. On the top face of the alignment stage 51, an operation pin 54 which can move along an inclined long hole 53 is projected. The ring frame "f" supplied and mounted on the alignment stage 51 is retained and moved from the inner radius by the operation pin 54 driven by an air cylinder 55, and the ring frame "f" is supported by the two pairs of positioning pins 52, thereby positioning the ring frame "f" in a predetermined position P2.

The tape tension mechanisms 23 are disposed on both sides of the tape bonding position $P_3$ as shown in FIGS. 2 and 4. Each of the tape tension mechanisms 23 is provided with a pair of upper and lower chuck nails 57. By the pairs of chuck nails 57, both sides in the width direction of the adhesive tape DT for support supplied to the tape bonding position $P_3$ are sandwiched. The pair of upper and lower chuck nails 57 is attached to an open/close actuator 58 which is air-driven, and are opened/closed in the vertical direction so as to be close to each other and apart from each other. A rubber piece is assembled in a sandwiching part of each of the chuck nails 57 so that the adhesive tape DT for support can be sandwiched without slip.

The open/close actuator 58 having the chuck nails 57 is supported by an air cylinder 59 fixedly coupled below the base 41 and can move in the tape width direction. Specifically, in a state where both sides in the width direction of the adhesive tape DT for support are sandwiched, the air cylinder 59 is contracted by the elastic force of an internally provided spring or weak air pressure, thereby expanding and contracting the adhesive tape DT for support in the width direction with proper tension.

Figure 5:
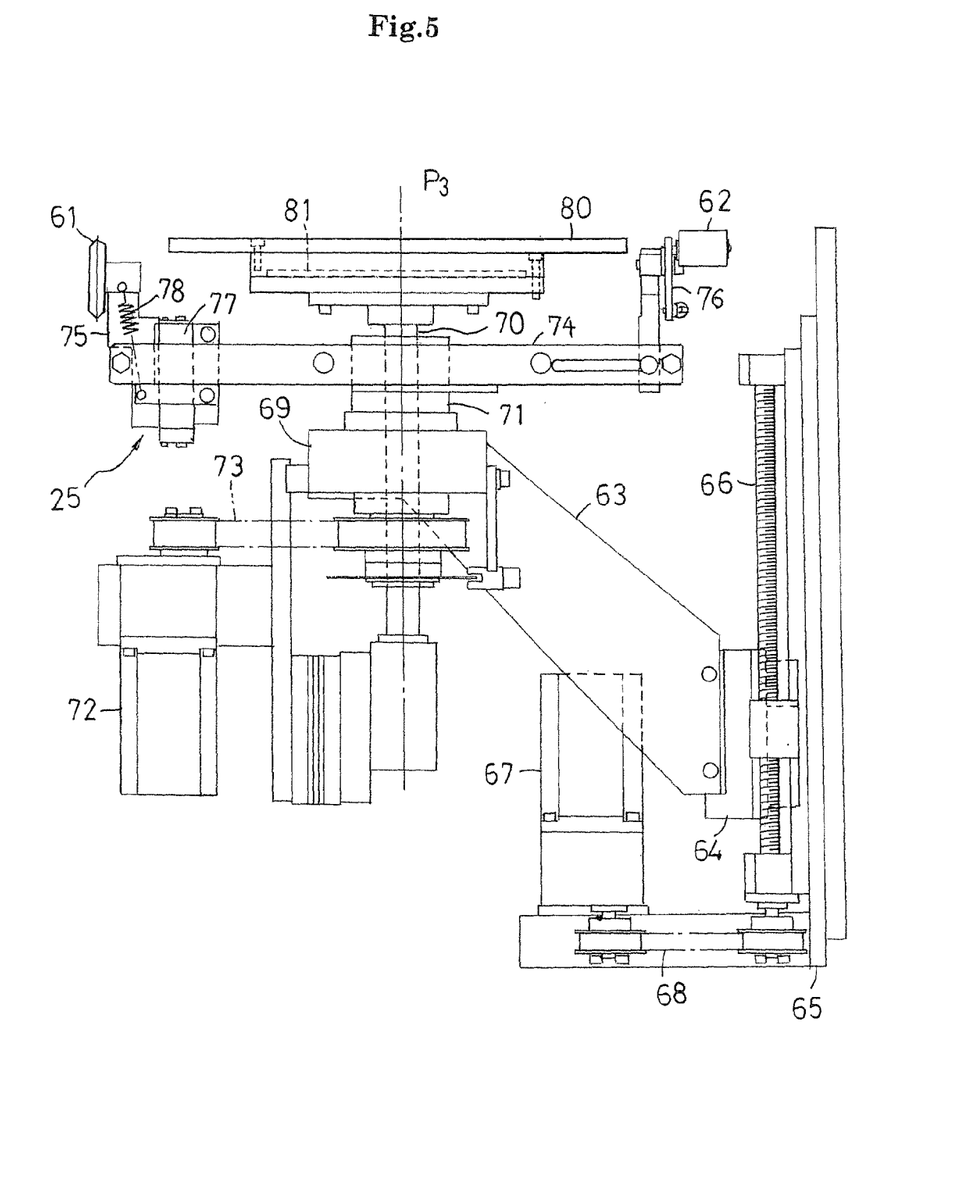
FIG. 5 is a front view showing a tape cutting mechanism.
Figure 6:
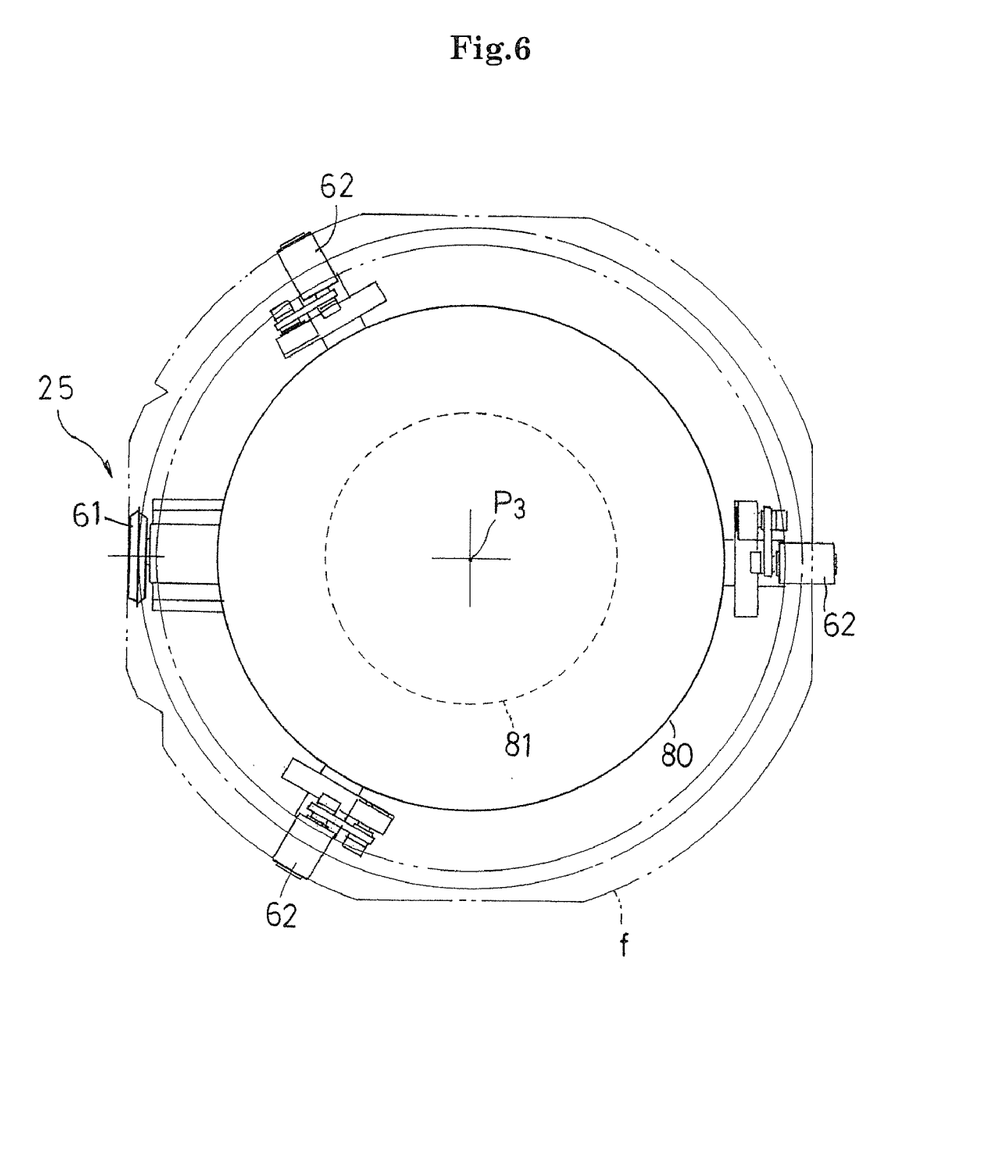
FIG. 6 is a plan view showing the tape cutting mechanism.

FIGS. 5 and 6 show the detailed structure of the tape cutting mechanism 25.

The tape cutting mechanism 25 is disposed just below the tape bonding position $P_3$. In the tape cutting mechanism 25, a disc-shaped cutter 61 disposed with a predetermined distance from the tape bonding position $P_3$ and three press rollers 62 disposed at equal pitches in the circumferential direction around the tape bonding position $P_3$ as a center are provided for an elevatable movable frame 63. The press roller 62 corresponds to tape bonding means of the invention.

The movable frame 63 is coupled to a movable block 64 which is elevated by screw. The movable block 64 is screwed in a screw shaft 66 attached perpendicularly to a fixing stand 65. The screw shaft 66 is interlockingly connected to an electronic motor 67 with a speed reducer via a toothed belt 68.

At the tip of the movable frame 63, a bearing boss 69 concentric with the tape bonding position $P_3$ is provided. A fixing spindle 70 is inserted in the center of the bearing boss 69 and a center boss 71 is rotatably attached. The lower end of the center boss 71 is interlockingly connected to an electronic motor 72 with a speed reducer via a toothed belt 73.

Support arms 74 are radially connected at the upper end of the center boss 71, and a cutter bracket 75 horizontally axially supporting the cutter 61 is attached to the tip of one of the support arms 74 so as to move in the vertical direction. The press roller 62 is attached to the tip of another support arm 74 via a swing arm 76 so as to be movable in the vertical direction. The cutter bracket 75 is supported so as to be lifted by an air cylinder 77 and lowered by a spring 78.

A heat radiation plate 80 is attached to the upper end of the fixing spindle 70 inserted in the center of the bearing boss 69. The heat radiation plate 80 is formed in a disc shape having a diameter smaller than the inner radius of the ring frame "f". A heater 81 is assembled in the heat radiation plate 80. The heat radiation plate 80 corresponds to tape heating means of the invention.

The outline of operations of the foregoing embodiment will now be described.

The wafer holding unit in the robot arm 4 is inserted in a gap in the cassette C. The wafers W are taken out one by one by being vacuum-held from below. The wafer W taken out is carried to the alignment stage 7.

The wafer W is aligned on the alignment stage 7 and, after that, the surface of the wafer W is irradiated with ultraviolet rays from the ultraviolet irradiating unit 8. After the ultraviolet ray irradiating process is performed, the wafer W is carried to the mount frame manufacturing unit 14 at the next stage.

When the alignment stage 7 waits in a predetermined position, the vacuum table 9 positioned upward descends, the under face of the vacuum table 9 comes into contact with the wafer W, and the vacuum table 9 starts vacuuming. After the vacuuming operation of the vacuum stage 9 starts, vacuum-holding on the alignment stage 7 side is finished. The wafer W is received by the vacuum table 9 in a state where a warp is corrected and held flat. The alignment stage 7 which has delivered the wafer W returns to the initial position.

Next, the ring frames "f" housed in multiple stages in the ring frame supplying unit 10 are taken out one by one from top by being vacuumed by the ring frame transport mechanism 11. The taken ring frame "f" is temporarily transferred onto the alignment stage 51 and aligned. After that, the ring frame "f" is again vacuum-held by the ring frame transport mechanism 11 and carried to the tape bonding position $P_3$.

When the ring frame "f" is held by the ring frame transport mechanism 11 and is in the tape bonding position $P_3$, supply of the adhesive tape DT for support from the tape supplying unit 22 starts. Simultaneously, the bonding roller 24 moves to the bonding start position.

Figure 7:
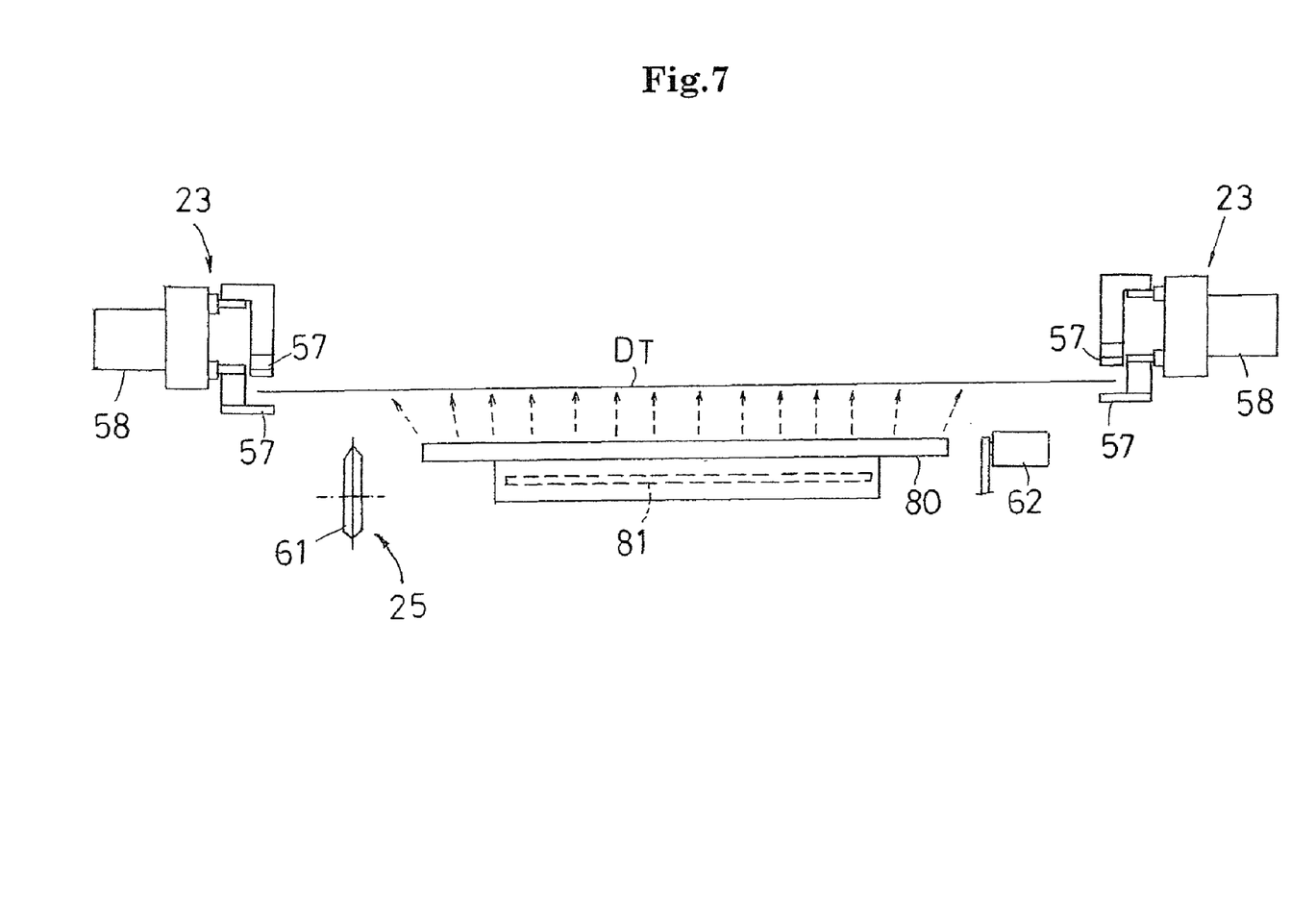
FIG. 7 is a schematic front view showing a process of heating an adhesive tape for support.

When the adhesive tape DT for support is supplied to the tape bonding position $P_3$, as shown in FIG. 7, the chuck nails 57 in the tape tension mechanism 23 open in the vertical direction and receive both ends in the width direction of the adhesive tape DT for support.

The tape cutting mechanism 25 and the heat radiation plate 80 are lifted and face the adhesive tape DT for support from below, and the adhesive tape DT for support is heated by heat irradiated from the heat radiation plate 80 for only predetermined time.

Next, after completion of the heating process, the heat radiation plate 80 descends to a withdrawal position in which the course of the bonding roller 24 is not disturbed. Almost simultaneously, the chuck nails 57 are closed, both ends in the width direction of the adhesive tape DT for support are sandwiched, and the open/close actuator 58 is moved backward by the operation of the air cylinder 59, thereby stretching the adhesive tape DT for support in the tape width direction with proper tension. Concurrently, the adhesive tape DT for support is stretched with proper tension in the tape transport direction also by feed rollers for feeding the adhesive tape DT for support, which are disposed before and after the ring frame "f". As a result, elongation caused in the adhesive tape DT for support by heating is absorbed, and the adhesive tape DT for support is properly tensioned without a wrinkle. The feed rollers disposed in the transport direction function as tape tensioning means of the invention.

Figure 8:
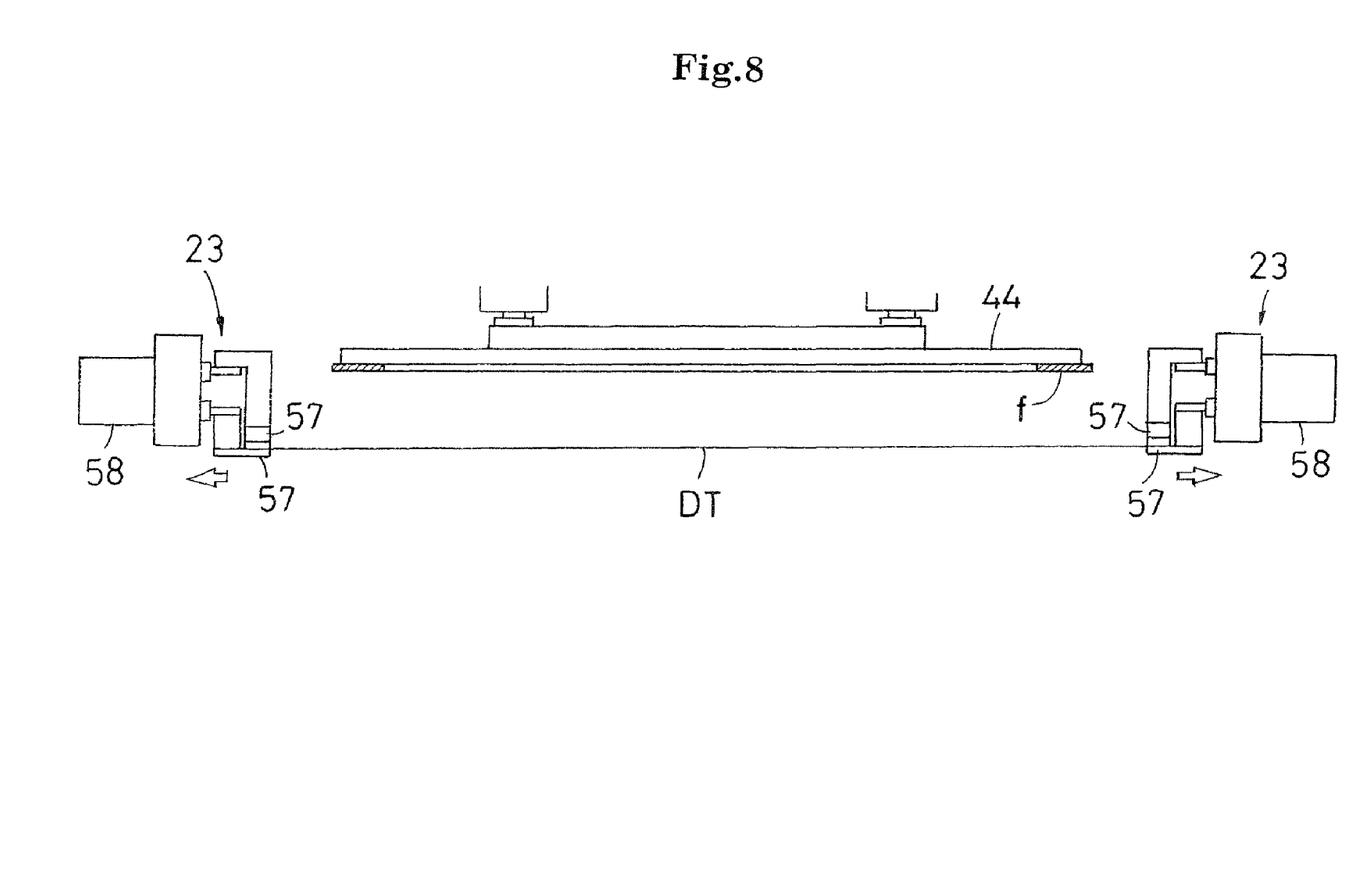
FIG. 8 is a schematic front view showing a process of tensing the adhesive tape for support.

As shown in FIG. 8, the ring frame "f" aligned on the aligned stage 51 is carried to the tape bonding position $P_3$.

Figure 9:
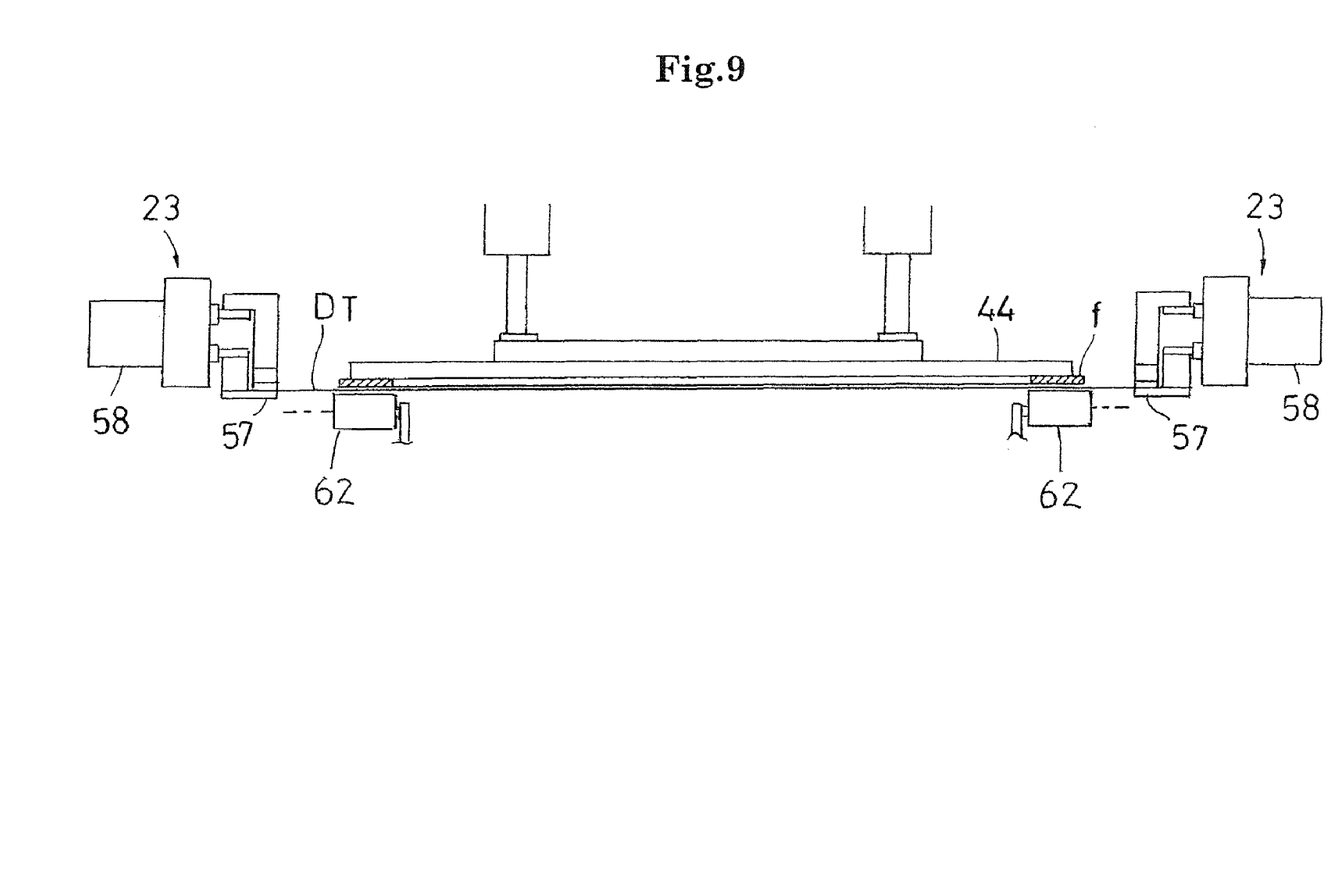
FIG. 9 is a schematic front view showing a process of bonding the adhesive tape for support.

After that, the ring frame "f" descends to an upward adhesion face of the adhesive tape DT for support which is heated and tensioned as shown in FIG. 9. The press rollers 62 ascend and rotate around the tape bonding position $P_3$ as a center. In such a manner, the adhesive tape DT for support is pressed along the under face of the ring frame "f" and bonded to the ring frame "f".

Figure 10:
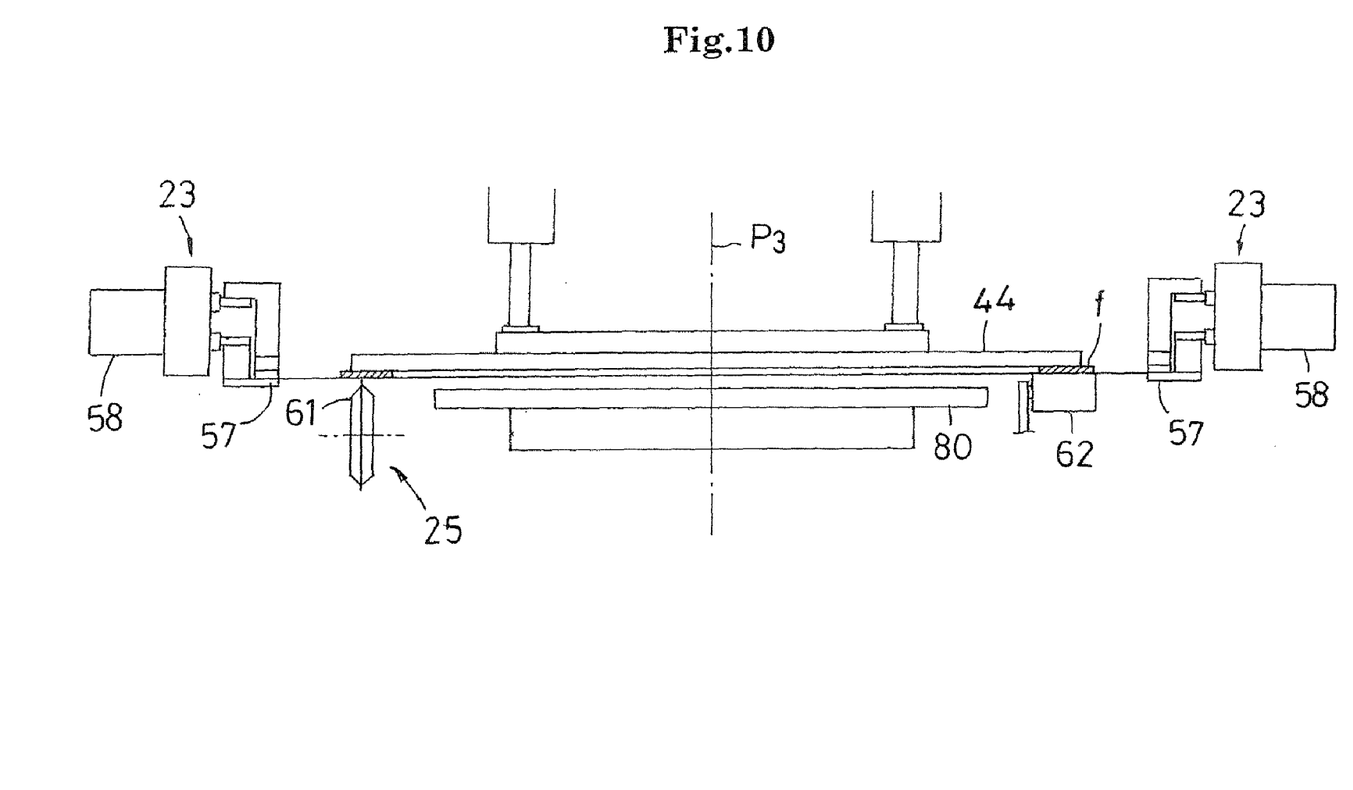
FIG. 10 is a schematic front view showing a process of cutting the bonded adhesive tape for support.

After completion of bonding, as shown in FIG. 10, the tape cutting mechanism 25 and the cutter ascend and are pressed against the under face of the ring frame "f". In this state, the cutter turns in predetermined radius about the tape bonding position $P_3$ as a center, thereby cutting the adhesive tape DT for support along the ring frame "f". In this case, the press rollers 62 rotate around the tape bonding position P3 as a center while being in contact with the under face of the ring frame "f" in three positions in the circumferential direction, so that the tape cutting mechanism 25 turns in a stable posture.

After cutting of the adhesive tape DT for support is finished, the peeling unit 26 moves toward the tape supplying unit 22 side to peel off the unnecessary adhesive tape DT for support.

Next, the tape supplying unit 22 operates to feed the adhesive tape DT for support, and the cut tape in the unnecessary portion is transmitted to the tape collecting unit 27. At this time, the bonding rollers 24 move to the bonding start position to bond the adhesive tape DT for support to the following ring frame "f".

The ring frame "f" to which the adhesive tape DT for support is bonded is vacuum-held by the ring frame elevating mechanism 13 and moved upward. At this time, the vacuum table 9 descends. That is, the vacuum table 9 and the ring frame elevating mechanism 13 move to the position of bonding the wafer W.

Next, as shown in FIG. 11, the bonding roller 28 moves to the bonding start position of the adhesive tape DT for support and rolls while pressing the under face of the adhesive tape DT for support bonded to the under face of the ring frame "f". Interlocking with the operation, the adhesive tape DT for support is bonded to the wafer W. As a result, the mount frame MF in which the ring frame "f" and the wafer W are integrated is manufactured.

After the mount frame MF is manufactured, the vacuum table 9 and the ring frame lifting mechanism 13 move upward. At this time, a not-shown holding table moves to a position below the mount frame MF, and the mount frame MF is mounted on the holding table. The mount frame MF mounted is vacuum-held by the first mount frame transport mechanism 15 and transferred onto a not-shown peeling table.

The peeling table on which the mount frame MF is mounted travels forward to a position below the peeling unit 32. The peeling tape Ts is bonded to the protection tape PT and, at a speed tuned to the travel speed, the peeling tape Ts is taken up toward the tape collecting unit 34. By the operation, the peeling tape Ts is bonded to the protection tape PT on the surface of the wafer W while pressing the peeling tape Ts. Simultaneously, while peeling off the bonded peeling tape Ts, the protection tape PT is also peeled off from the surface of the wafer W.

The mount frame MF subjected to the process of peeling off the protection tape PT is sent to the standby position of the second mount frame transport mechanism 17. The mount frame MF sent from the peeling mechanism 16 is transferred onto the turn table 18 by the second mount frame transport mechanism 17. The transferred mount frame MF is aligned by using the orientation flat or notch, thereby performing adjustment in the housing direction. After the alignment and determination of the housing direction, the mount frame MF is pushed by the pusher and housed in the mount frame collecting unit 19. The series of operations are finished.

As described above, the adhesive tape DT for support is heated and tensioned uniformly in the tape width direction and the transport direction. The adhesive tape DT for support in the tensioned state is bonded to the ring frame "f". Consequently, even if the wafer W receives heat radiated from the heat radiation plate 80, the adhesive tape DT for support is not stretched more than the present tensioned state. Therefore, when the work W is bonded to the adhesive tape DT for support, a wrinkle occurring due to the influence of heat can be suppressed, and the wafer W can be suitably bonded to and supported by the adhesive tape DT for support.

The present invention can be also carried out in the following modes.

(1) Although the adhesive tape DT for support is bonded to the ring frame "f" and, after that, the wafer W is bonded to the adhesive tape DT for support in the foregoing embodiment, the following mode may be also employed.

For example, the ring frame "f" aligned by the alignment stage 51 is mounted and held by the holding table and the wafer W is mounted and held in the center of the ring frame "f" so that the surface level of the wafer W becomes almost the same as that of the ring frame "1". In the state, the adhesive tape D for support is supplied onto the holding table and heated by the heat radiation plate 80. After that, both sides in the tape width direction of the adhesive tape DT for support are sandwiched by the chuck nails 57, and the adhesive tape DT for support is stretched and tensioned with proper tension. Simultaneously, the adhesive tape DT for support is stretched and tensioned with proper tension in the tape transport direction by the pair of rollers that feed the adhesive tape DT for support. The bonding roller 28 is rolled on the non-adhesive face of the tensioned adhesive tape DT for support to bond the adhesive tape DT for support so that the ring frame "f" and the wafer W are integrated.

(2) Although the heat radiation plate 80 is used as the means for heating the adhesive tape DT for support before bonding in the foregoing embodiment, the adhesive tape DT for support can be heated also by supplying warm air from a nozzle toward the adhesive tape DT for support.

(3) The thin plate-shaped work to be processed is not limited to the semiconductor wafer but may be a glass substrate or the like.

The present invention may be embodied in other specific forms without departing from the spirit or essential attributes thereof and, accordingly, reference should be made to the appended claims, rather than to the foregoing specification, as indicating the scope of the invention.

What is claimed is:

1. A work bonding and supporting apparatus for bonding a work to an adhesive tape for support to support the work, comprising:
    a ring frame transport mechanism for carrying a ring frame in a tape bonding position;
    tape supplying means for supplying a continuous adhesive tape for support to the tape bonding position in a posture that an adhesive face of the adhesive tape for support faces the back side of the ring frame;
    tape tensioning means for stretching the adhesive tape for support supplied to the tape bonding position by holding at least one or both of facing sides in the width direction of the adhesive tape for support and front and rear sides in the supply direction of the adhesive tape for support;
    tape heating means for heating the adhesive tape for support supplied to the tape bonding position;
    tape bonding means for pressing the adhesive tape for support against the back side of the ring frame;
    a tape cutting mechanism for cutting the adhesive tape for support bonded to the back side of the ring frame along the ring frame; and
    work bonding means for supplying and bonding a work in a heated state to the adhesion face of the adhesive tape for support bonded to the ring frame.

2. The work bonding and supporting apparatus according to claim 1, wherein the tape heating means is a heat radiation plate facing in parallel with the adhesive tape for support in the tape bonding position.

3. The work bonding and supporting apparatus according to claim 2, wherein the tape cutting mechanism has a cutter traveling along a travel locus corresponding to the shape of the ring frame, and the heat radiation plate is provided on the inside of the travel locus.

4. The work bonding and supporting apparatus according to claim 1, wherein the tape heating means is a nozzle for spraying warm air to the adhesive tape for support in the tape bonding position.

5. The work bonding and supporting apparatus according to claim 1, wherein the work bonding means comprises:
    a chuck table having therein a heater and vacuum-holding the surface of a work;
    a holding mechanism for holding a ring frame;
    a driving mechanism for moving a work to a tape bonding position by making the chuck table and the holding mechanism come close to each other; and
    a bonding roller that rolls while pressing the adhesive tape from the back side of the ring frame in the tape bonding position to bond the adhesive tape to the work.

6. The work bonding and supporting apparatus according to claim 1, wherein the tape bonding means is a press roller which rolls along the back side of the ring frame.

7. The work bonding and supporting apparatus according to claim 6, wherein a plurality of press rollers as the tape bonding means are disposed at predetermined intervals along an adhesion face of the ring frame,
    a cutter in the tape cutting mechanism is disposed on the same travel locus as that of the press rollers,
    the apparatus further comprises
    a roller moving mechanism for moving the press roller between a tape bonding position and a standby position apart from the ring frame, and
    cutter moving means for moving the cutter between a tape cutting position and a standby position apart from the ring frame,
    both of the roller moving mechanism and the cutter moving means are driven to bond the adhesive tape to the ring frame by the press roller, return the press roller to the standby position, after that, move the cutter to the tape cutting position to cut the adhesive tape.

8. The work bonding and supporting apparatus according to claim 6, wherein a plurality of press rollers as the tape bonding mechanism are disposed at predetermined intervals along an adhesion face of the ring frame,
    a cutter in the tape cutting mechanism is disposed on the same travel locus as that of the press rollers,
    the apparatus further comprises
    a roller moving mechanism for moving the press roller between a tape bonding position and a standby position apart from the ring frame, and
    cutter moving means for moving the cutter between a tape cutting position and a standby position apart from the ring frame, and
    both of the roller moving mechanism and the cutter moving means are driven so as to cut a bonded adhesive tape by the cutter while bonding the adhesive tape to the ring frame by the press roller.

* * * * *